US012648398B2

(12) United States Patent
Li et al.

(10) Patent No.: US 12,648,398 B2
(45) Date of Patent: Jun. 2, 2026

(54) METHODS AND SYSTEMS HAVING CONDUCTIVE POLYMER COATING FOR ELECTROSTATIC DISCHARGE APPLICATIONS

(71) Applicant: ENTEGRIS, INC., Billerica, MA (US)

(72) Inventors: Zhifeng Li, Acton, MA (US); Pushkara Rao Varanasi, Poughkeepsie, NY (US); Michael C. Zabka, New Prague, MN (US)

(73) Assignee: Entegris, Inc., Billerica, MA (US)

( * ) Notice: Subject to any disclaimer, the term of this patent is extended or adjusted under 35 U.S.C. 154(b) by 378 days.

(21) Appl. No.: 18/086,432

(22) Filed: Dec. 21, 2022

(65) Prior Publication Data

US 2023/0197491 A1    Jun. 22, 2023

Related U.S. Application Data

(60) Provisional application No. 63/292,927, filed on Dec. 22, 2021.

(51) Int. Cl.
| | |
|---|---|
| *H01L 21/673* | (2006.01) |
| *C09D 5/24* | (2006.01) |
| *H10P 72/10* | (2026.01) |

(52) U.S. Cl.
CPC ............ *H10P 72/1928* (2026.01); *C09D 5/24* (2013.01); *H10P 72/1911* (2026.01); *H10P 72/1922* (2026.01)

(58) Field of Classification Search
CPC ......... H01L 21/67396; H01L 21/67366; H01L 21/67386; H01L 21/67323; H01L 21/67775; C09D 5/24; C08J 7/14
See application file for complete search history.

(56) References Cited

U.S. PATENT DOCUMENTS

| | | | |
|---|---|---|---|
| 6,719,142 | B1 | 4/2004 | Menear et al. |
| 6,746,770 | B1 | 6/2004 | Afzali-Ardakani et al. |
| 11,056,409 | B2 | 7/2021 | Jiang et al. |
| 2005/0254190 | A1 | 11/2005 | Kwon et al. |
| 2006/0145127 | A1 | 7/2006 | Lockridge |
| 2011/0079539 | A1 | 4/2011 | Kamada |
| 2012/0103860 | A1 | 5/2012 | Masuko |
| 2012/0168685 | A1* | 7/2012 | Kim ........................... C08J 7/14 |
| | | | 252/500 |
| 2015/0014191 | A1 | 1/2015 | Suzuki et al. |
| 2017/0183512 | A1 | 6/2017 | Han et al. |

(Continued)

FOREIGN PATENT DOCUMENTS

| | | |
|---|---|---|
| CN | 102333825 A | 1/2012 |
| CN | 104662628 B | 1/2019 |

(Continued)

*Primary Examiner* — John D Freeman

(57) ABSTRACT

A semiconductor processing apparatus including: a substrate comprising a polymer material layer; and a conductive polymer coating layer that coats at least a portion of the polymer material layer of the substrate, wherein the conductive polymer coating layer comprises conjugated polymers, wherein the conductive polymer coating layer has a total extractable metals less than 400 ng/g, and wherein the conductive polymer coating layer is configured to discharge electrostatic buildup in the semiconductor processing apparatus when connected to a semiconductor processing system.

14 Claims, 6 Drawing Sheets

(56)     References Cited

U.S. PATENT DOCUMENTS

| | | | |
|---|---|---|---|
| 2021/0008503 | A1 | 1/2021 | Quan et al. |
| 2021/0202297 | A1 | 7/2021 | Hung et al. |

FOREIGN PATENT DOCUMENTS

| | | | | |
|---|---|---|---|---|
| CN | 107109107 | B | | 8/2020 |
| CN | 111655800 | A | | 9/2020 |
| JP | H08288190 | A | | 11/1996 |
| JP | 2004314994 | A | * | 11/2004 |
| JP | 2006104314 | A | * | 4/2006 |
| JP | 2008179699 | A | * | 8/2008 |
| JP | 2009178897 | A | * | 8/2009 |
| JP | 2010202751 | A | | 9/2010 |
| JP | 2011246858 | A | | 12/2011 |
| JP | 2013049801 | A | | 3/2013 |
| JP | 2014154592 | A | | 8/2014 |
| JP | 2017105982 | A | | 6/2017 |
| KR | 1020210096934 | A | * | 8/2021 |
| TW | 201234391 | A | | 8/2012 |
| WO | 2009076389 | A1 | | 6/2009 |
| WO | 2013013070 | A9 | | 3/2013 |

* cited by examiner

220

210

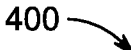
400

| Coating at least a portion of at least one of a substrate or semiconductor supporting structure of a semiconductor handling apparatus with a conductive polymer coating layer | 410 |

↓

| Drying the substrate and/or the semiconductor supporting structure having the conductive polymer coating layer | 420 |

↓

| Soaking the dried substrate and/or the semiconductor supporting structure having the conductive polymer coating layer in 5% HCl aqueous solution | 430 |

↓

| Removing the substrate and/or the semiconductor supporting structure having the conductive polymer coating layer from the 5% HCl aqueous solution and rinsing and/or soaking the substrate and/or the semiconductor supporting structure having the conductive polymer coating layer in deionized water | 440 |

↓

| Drying the substrate and/or the semiconductor supporting structure having the conductive polymer coating layer | 450 |

FIG. 4

METHODS AND SYSTEMS HAVING CONDUCTIVE POLYMER COATING FOR ELECTROSTATIC DISCHARGE APPLICATIONS

PRIORITY

This disclosure claims priority to U.S. provisional patent No. 63/292,927 with a filing date of Dec. 22, 2021, which is incorporated by reference herein.

FIELD

This disclosure relates to semiconductor processing and apparatuses used therein. More specifically, this disclosure relates to a conductive polymer coating on substrates for apparatuses used in semiconductor processing to provide electrostatic discharge mitigation.

BACKGROUND

Apparatuses used in semiconductor processing includes apparatuses to protect, manufacturer, transport, and deliver wafers, reticles, and other substrates and that prevent degradation and contamination (e.g., chemical, particulates, gases, or the like) during the manufacturing and transportation of the same. Such apparatuses include, but are not limited to, front opening united pods (FOUP), reticle pods, wafer carriers, other containers and boxes used in semiconductor processing, robotic arms, load/unload ports, and fluid handling pipes, filters, valves, and connectors, and the like.

The apparatuses used in the semiconductor processing, however, are inherently electrically insulating materials and are susceptible to a buildup of electrostatic charge that can lead to damage in the semiconductor processing system. Thus, preventing electrostatic discharge (ESD) is an important technical issue for semiconductor processing systems and in other technology applications. For example, frictional contact between fluids and surfaces of various operational components (e.g., carriers, transporters, tubing or piping, valves, fittings, etc.) in the semiconductor processing system can result in generation and buildup of static electrical charges. The extent of charge generation depends on various factors including, but not limited to, the nature of the components, the type of contact between components, relative humidity, pathways to ground, and surface area. Furthermore, as the fluid flows through the system, the charge can be carried downstream in a phenomenon called a streaming charge, where charge can buildup beyond where the charge originated. Sufficient charge accumulations can cause discharges at the pipe walls, component surfaces, or even onto substrates or wafers at various process steps.

The buildup of static electricity leads to harmful side effects, such as, spark and shorts, in which affected parts become dangerous or hard to work with, and sudden discharges can damage electronics or cause explosions. Additionally, many semiconductor devices are very sensitive to the presence of static electricity. For example, semiconductor substrates are highly sensitive and such discharges can result in damage or destruction of the substrate, e.g., circuits on the substrate can be destroyed and photoactive compounds can be activated prior to regular exposure. Additionally, built up static charge can discharge from within operative components of the fluid management system to the exterior environment, potentially damaging components in the plumbing (e.g. tubing, fittings, containers, filters, etc.), and leading to leaks, spills of fluid in the system, and diminished performance of components, which can lead to fires and/or explosions. There is a need to find solutions for dissipating electrostatic charge in semiconductor processing systems in general to improve production yields, decrease manufacturing costs, and increase product quality and product reliability.

SUMMARY

This disclosure relates to semiconductor processing and apparatuses used therein. More specifically, this disclosure relates to a conductive polymer coating on substrates for apparatuses used in semiconductor processing to provide electrostatic discharge mitigation.

In an embodiment, a semiconductor processing apparatus is provided that includes a substrate having a polymer material layer; a conductive polymer coating layer that coats at least a portion of the polymer material layer of the substrate, in which the conductive polymer coating layer includes conjugated polymers, in which the conductive polymer coating layer has a total extractable metals of less than 400 ng/g, in which the conductive polymer coating layer is configured to discharge electrostatic buildup in the semiconductor processing apparatus when connected to a semiconductor processing system.

In another embodiment, a method is provided for coating a semiconductor processing apparatus for controlling electrostatic discharge in a semiconductor processing process including coating at least a portion of at least one of a substrate or semiconductor supporting structure of a semiconductor processing apparatus with a conductive polymer coating layer, wherein the substrate and/or the semiconductor supporting structure comprises a polymer material layer, wherein the conductive polymer coating layer comprises conjugated polymers; drying the substrate and/or the semiconductor supporting structure having the conductive polymer coating layer; soaking the dried substrate and/or the semiconductor supporting structure having the conductive polymer coating layer in 5% HCl aqueous solution; removing the substrate and/or the semiconductor supporting structure having the conductive polymer coating layer from the 5% HCl aqueous solution and rinsing and/or soaking the substrate and/or the semiconductor supporting structure having the conductive polymer coating layer in deionized water; and drying the substrate and/or the semiconductor supporting structure having the conductive polymer coating layer, in which the conductive polymer coating layer has a total extractable metals less than 400 ng/g.

BRIEF DESCRIPTION OF THE DRAWINGS

FIG. 4 is a flowchart illustrating a conductive polymer coating method, according to at least one example embodiment.

Like reference characters refer to similar features.

DETAILED DESCRIPTION

Figure 1:
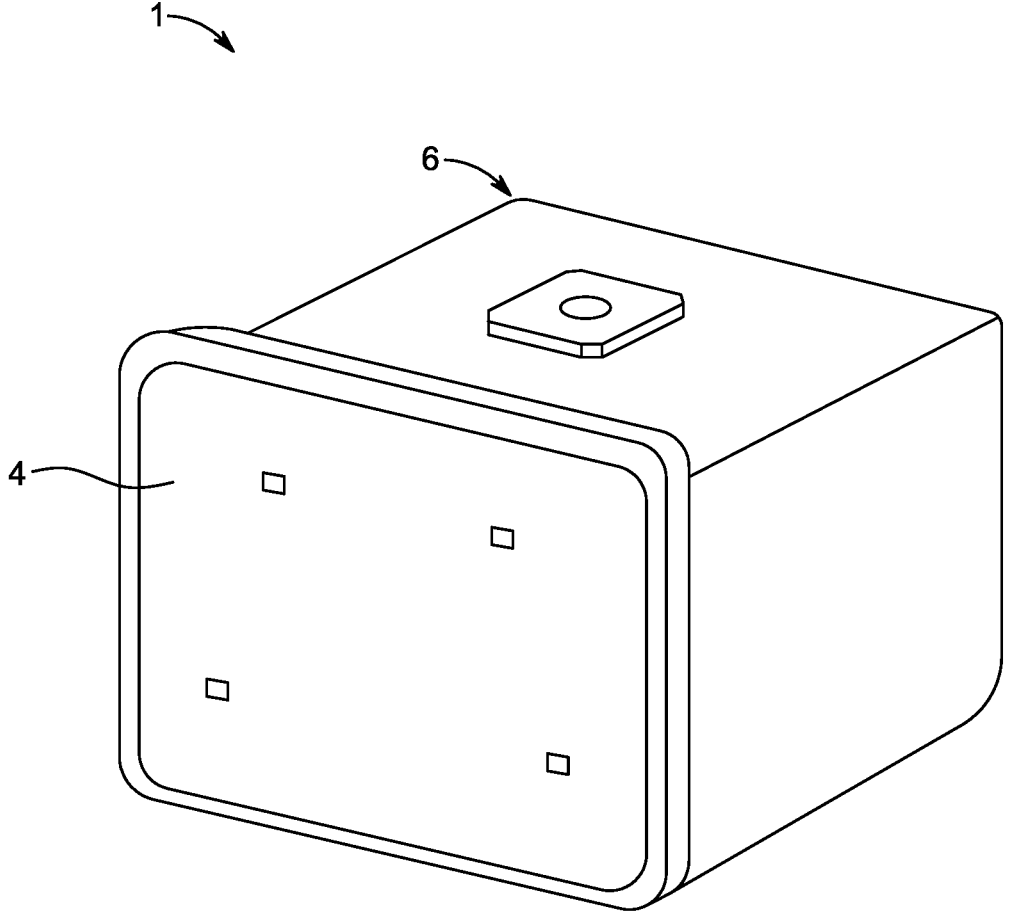
FIG. 1 is a front prospective view of a container having a conductive polymer coating layer, according to at least one example embodiment.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise. As used in this specification, the term "about" is generally used to include +/−5% of the value included therewith.

Particular embodiments of the present disclosure are described herein with reference to the accompanying drawings; however, it is to be understood that the disclosed embodiments are merely examples of the disclosure, which can be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. In this description, as well as in the drawings, like-referenced numbers represent elements that can perform the same, similar, or equivalent functions.

The scope of the disclosure should be determined by the appended claims and their legal equivalents, rather than by the examples given herein. For example, the steps recited in any method claims can be executed in any order and are not limited to the order presented in the claims. Moreover, no element is essential to the practice of the disclosure unless specifically described herein as "critical" or "essential."

This disclosure relates to semiconductor processing and apparatuses used therein. More specifically, this disclosure relates to a conductive polymer coating on substrates for operative components used in semiconductor processing to provide electrostatic discharge mitigation.

In order to meet the high purity requirements for semiconductor processing, the apparatuses of the semiconductor processing systems provide FOUPs, reticle pods, wafer carriers, other containers and boxes, robotic arms, load/unload ports, tubing, fittings, valves, and other elements, that are made from polymers, for example, an electrically inert polymer. These electrically inert polymers may include, but are not limited to, polycarbonate, polyethylene, such as, high density polyethylene (HDPE) and ultra-high molecular weight polyethylene (UPE), polypropylene, polyolefin, polyether ether ketone (PEEK), or combinations thereof. These materials, however, are inherently electrically insulating materials and are susceptible to a buildup of electrostatic charge that can lead to damage in the semiconductor processing system.

It is understood that electric static is a surface charge problem in which an imbalance of electrical charges is on the surface of the material, thus, electrostatic dissipative materials have been used to prevent the buildup of static charge. Some electrostatic dissipative materials are produced from a compounding of a polymer resin, such as polycarbonate, polypropylene, a fluoropolymer, such as perfluoroalkoxy alkanes, or the like, and a conductive filler, such as, metallic particles, or the like, which is then molded into the final semiconductor processing apparatus and/or components thereof. The compounding of the polymer resin with the conductive filler, however, was found to not only affect the material property of the polymer resin, for example, increased brittleness of the product, but also may result in products that do not meet at least some cleanliness requirements for semiconductor processing, e.g., purity limits on outgassing, extractable metals, or the like. For example, it is understood that many materials continually outgas molecular contamination and also absorb chemicals from the air, which can be released during semiconductor processing. Similarly, metal content provided on the substrate can have detrimental impact on the device performance and yield, for example, introducing mobile charges, by degrading gate oxide integrity, causing recombination of centers, junction leakage, or dark current, or the like.

While conductive polymer coatings have been used widely in many different industries for ESD applications, the conductive polymer coatings were not typically usable in semiconductor processing since the prior conductive polymer coatings also do not meet at least some cleanliness standards set for semiconductor processing, which may lead to unacceptable contamination of the product, e.g., wafers, reticles, or the like. For example, U.S. Pat. No. 10,731,041 to Heraeus Medical Components LLC discloses electrically conductive polymeric coatings that are suitable for application to three-dimensional substrates and/or to substrate surfaces having a high degree of flexibility. While the electrically conductive polymeric coating provides conductivity, durability, and abrasion resistance, the electrically conductive polymeric coating does not meet at least some cleanliness requirements for semiconductor processing, e.g., unacceptable levels of outgassing and extractable metals content.

While electrostatic dissipative materials that are produced from a compounding of a polymer resin and carbon black, carbon nanotubes, or the like is a solution to the above deficiencies, this disclosure relates to apparatuses used in semiconductor processing that overcomes the deficiencies of the prior art by having a thin film layer of conductive polymer coating to provide electrostatic discharge mitigation that meets the cleanliness requirements for semiconductor processing. Specifically, the conductive polymer coatings are provided as a thin film surface coating layer on a surface of the apparatus used in the semiconductor process. The conductive polymer coating meets the cleanliness requirements by at least having an outgassing of less than 2 μg/g, preferably less than 1 μg/g, and most preferably less than 0.5 μg/g, and a total extractable metals of less than 400 ng/g, preferably less than 200 ng/g, and most preferably less than 100 ng/g. By providing the conductive polymer coating on the surface of the substrate, the ESD function can be accomplished without changing the properties of the product material itself, eliminates the compounding process, improves cleanliness control, is more cost effective since coating a substrate is less expensive then compounding and molding, and the color is semi-transparent or light blue. It is appreciated that the conductive polymer can be a homogenous conductive polymer layer that consists essentially of the conductive polymer or the conductive polymer can be provided as particles and/or compounds within a binder as a surface layer or compounded with the substrate material to provide the electrostatic discharge mitigation.

In some embodiments, to reduce the buildup of static charges, certain components in the semiconductor processing apparatus are grounded to mitigate the buildup of static in the system since the conductive polymer coating layer is configured to continually disperse the electrostatic buildup to ground, as further discussed below.

In this application, "conductive polymers" are organic polymers that conduct electricity. Without wishing to be bound by theory, it is understood that the conductive polymers have backbones of contiguous sp$^2$ hybridized carbon centers. One valence electron on each center resides in a p$_z$ orbital, which is orthogonal to the other three sigma-bonds. All the p$_z$ orbitals combine with each other to a molecule wide delocalized set of orbitals. The electrons in these delocalized orbitals have high mobility when the material is "doped" by oxidation, which removes some of these delocalized electrons. Thus, the conjugated p-orbitals form a one-dimensional electronic band, and the electrons within this band become mobile when it is partially emptied. These same materials can also be doped by reduction, which adds electrons to an otherwise unfilled band. In practice, most organic conductors are doped oxidatively to give p-type materials.

In an embodiment, the conductive polymer includes conjugated polymers. The term "conjugated polymers" refers to organic macromolecules that are characterized by a backbone chain of alternating double- and single-bonds. The overlapping p-orbitals create a system of delocalized x-electrons to result in electronic properties.

The conductive polymers can include polymers such as polyacetylene, a poly(fluorene), a polyphenylene, a polyphenylene vinylene, a polypyrene, a polyazulene, a polynaphthalene, a poly(pyrrole), a polycarbazole, a polyindole, a polyazepine, a polyaniline, a polyacene, a polythiophene, a polythiophene vinylene, a poly(p-phenylene sulfide), a polypyridine, or functionalized derivatives, precursors or combinations thereof.

For example, in a non-limiting example, the conductive polymer can include polymers such as:

the polymers having the N-containing heteroatom in the aromatic cycle include polypyrrole, polycarbazole, polyindole, and polyazepine, and polymers having the N-containing heteroatom outside the aromatic cycle is polyaniline. The polymers having the S-containing heteroatom in the aromatic cycle include polythiophene and poly(3,4-ethylenedioxythiophene), and the polymers having the S-containing heteroatom outside the aromatic cycle is poly(p-phenylene sulfide).

Typically, the conductive polymer is cationic. Thus, in some embodiments, a primary counter ion is provided that substantially neutralizes the charged functional groups associated with the conductive polymer. The primary counter ion can include one or more repeat units having a negatively charged functional group. FIG. 1 is a perspective view of a container 1, according to an embodiment. As shown in FIG. 1, the container 1 includes a front door 4 and a shell 6. The front door 4 is received within a front opening of the shell 6, blocking the front opening. The shell 6 defines an interior space of the container, in which wafers or reticles can be stored in the interior space of the container 1. The container 1 can be accessed by moving (e.g., opening, removing) the door 4. For example, the door 4 in FIG. 1 is received in the shell 6 by inserting the door 4 into the shell 6. In an embodiment, one or more of the door 4 and the shell 6 can include a locking mechanism (not shown) to prevent accidental removal of the door 4. The container 1 may be, for example, a front opening unified pod (FOUP) or a container for a reticle, such as a reticle pod.

The shell 6 includes a first side wall, a second side wall, a rear wall, and a top wall, and a bottom wall. The first side wall is opposite to the second side wall, and the top wall is opposite the bottom wall. The container 1 can include an

PEDOT:PSS

POLYACETYLENE

POLYPHENYLENE

POLYPYRROLE

POLYTHIOPHENE

POLY(PHENYLENE-SULFIDE)

POLYANILINE

In a preferred embodiment, the conductive polymers are conjugated polymers that include a main chain that includes aromatic cycles and has nitrogen (N) or sulfur(S) containing heteroatoms, in which the N or S heteroatom is either in the aromatic cycle or outside the aromatic cycle. For example, equipment hookup on the top wall of the shell 6. In an embodiment, the equipment hookup allows a standard automated attachment (not shown) for moving the container 1, such as but not limited to an automated robotic arm, to be connected to the container 1. For example, the automated robotic arm may be used to move the container 1 between different processing equipment. In an embodiment, the container 1 may include one or more handles (not shown) to allow a user (e.g., a technician, etc.) to manually move the container 1. The container 1 can include on the bottom wall, a plurality of inlet purge port(s) and/or outlet purge port(s) corresponding to inlet(s) and/or outlet(s) of the container 1. The plurality of inlet purge port(s) (and outlet purge ports) can be connected to a purge flow distribution system for purging and discharging a purge gas from the container 1.

The container 1 can include a plurality of wafer or reticle supporting structures, for example, shelves for holding wafer or reticle (not shown) in the interior space. The shelves can be inserted into rails or slots and are sized to each hold a wafer or reticle (not shown) within the interior space. For example, the shelves in an embodiment are sized to hold a specific size of wafer or reticle (e.g., 150 mm wafers, 200 mm wafers, etc.). The container 1 can be loaded and/or unloaded from a load/unload port for loading the wafer or reticle into the container 1 and/or for processing the wafer or reticle in the container 1.

The container 1 can be made from polymers, for example, an electrically inert polymer. These electrically inert polymers may include, but are not limited to, polycarbonate, polyethylene, high density polyethylene (HDPE), polypropylene, polyolefin, cyclic olefin copolymer, polyether ether ketone (PEEK), or combinations thereof.

Figure 2:
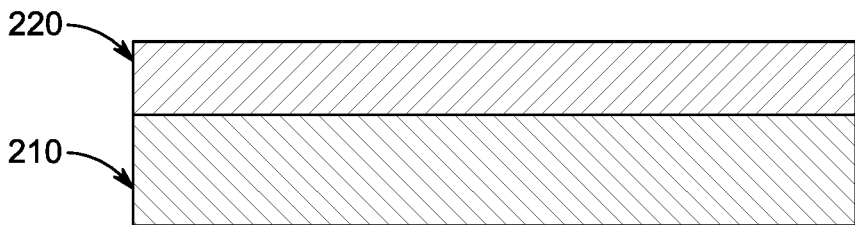
FIG. 2 is a schematic representation of the conductive polymer coating layer, according to at least one example embodiment.

FIG. 2 shows, in an embodiment, that the conductive polymer coating layer 220 can be coated on at least a portion 210 of the container 1, which includes in a non-limiting manner, the outer surface and/or the inner surface of the side wall, the rear wall, the top wall, and a bottom wall, the door, the substrate supporting structure, or a combination thereof. The conductive polymer coating layer 220 can coat the entire surface, or just a portion thereof in such a way that the conductive polymer coating layer is able to provide a path to ground to discharge electrostatic buildup in the container. For example, the conductive polymer coating layer 220 can be provided as a coating strip along the outer surfaces of the top wall, side walls, and bottom wall of the container and/or coat the entirety thereof. Thus, when the container 1 is loaded on the load/unload port, a path to ground is provided through the conductive polymer coating layer 220 and the ground provided in the load/unload port.

It is appreciated that in an embodiment, the conductive polymer coating layer 220 can be coated on a surface layer of the container 1 having a thickness between 50 nanometers to 50 micrometers, and preferably between 200 nanometers and 10 micrometers, and more preferably between 200 nanometers and 500 nanometers. The desired thickness of the conductive polymer coating layer is not limited thereto, since the desired thickness of the conductive polymer coating layer is dependent on the use of the apparatus and conditions of use of the apparatus. Since the conductive polymer coating layer 220 is provided as a thin coating layer on a surface layer of the substrate, several advantages are provided. For example, since the conductive polymer coating layer is provided on the surface layer of the substrate, the conductive polymer coating layer is a surface active material and does not change the physical and/or mechanical properties of the underlying substrate, while providing similar or better conductivity than the compounded polymer resin with conductive fillers of the prior ESD materials. Additionally, since the conductive polymer coating layer is a separate layer coated on the substrate, the cleanliness of the conductive polymer coating layer is easier to control since the materials used to provide the conductive polymer coating layer is limited to the conductive polymers and, optionally, additives, binders, solvents, surfactants, or the like, used with the conductive polymer. Furthermore, it is appreciated that since the electrostatic dissipative material is not produced from a compounding of a polymer resin and a conductive metal filler, but is instead a coating of a conductive polymer, the conductive polymer coating layer can be provided as a semi-transparent or blue coating layer in order to provide the substrate with different colorings.

In an embodiment, the conductive polymer coating layer 220 can include conjugated polymers having overlapping p-orbitals, in which the conjugated polymers refer to organic macromolecules that are characterized by a backbone chain of alternating double- and single-bonds. For example, the conjugated polymers can include a main chain that includes aromatic cycles and has nitrogen (N) or sulfur(S) containing heteroatoms, in which the N or S heteroatom is either in the aromatic cycle or outside the aromatic cycle. The polymers having the N-containing heteroatom in the aromatic cycle include polypyrrole, polycarbazole, polyindole, and polyazepine, and polymers having the N-containing heteroatom outside the aromatic cycle include polyaniline. The polymers having the S-containing heteroatom in the aromatic cycle include polythiophene and poly(3,4-ethylenedioxythiophene), and the polymers having the S-containing heteroatom outside the aromatic cycle include poly(p-phenylene sulfide). The conductive polymer coating layer 220 can also include additives, such as methacrylate, acrylate, and/or acrylamide based monomers, vinyl based monomers, photo-active binders or photopolymer, stabilizers, such as, 2,2,6,6-tetramethyl piperidine and its derivatives, benzophenones, benzofuranones, oxanilides, p-phenylenediamines, N-(1,3-dimethylbutyl)-N'-phenyl-p-phenylenediamine, N-isopropyl-N'-phenyl-p-phenylenediamine, 6-ethoxy-2,2, 4-trimethyl-1,2-dihydroquinoline, ethylene diurea, hindered phenols, aromatic amines, benzotriazoles, and hydroxyphenyltriazines, thickening agents, solvents, surfactants, cross-linking agents, binders that place and bind the materials of the coating layer together, provide adhesion, durability, flexibility, gloss, and the like. Thus, it is appreciated that the conductive polymer coating layer 220 consists essentially of polymers for providing conductivity to discharge electrostatic buildup in the apparatus, and does not include conductive fillers, such as, metals, or the like for providing the conductivity of the layer.

In an embodiment, the conjugated polymer is PEDOT: PSS which is made by aqueous oxidative polymerization of the monomer 3,4-ethylenedioxythiophene (EDOT) in the presence of the polystyrene sulfonic acid (PSS or PSSA). It is understood that the PSS in the complex functions as a counter ion for the cationic, conductive PEDOT, forming a stable, easy-to-process dispersion of PEDOT:PSS polymer gel particles. These gel particles consist roughly of 90 to 95% water in the dispersion, have excellent film forming properties, and are easily processable into thin coatings of the conductive polymer coating layer on a variety of substrates.

It is appreciated that since the conjugated polymer of the conductive polymer coating layer 220 does not include a water molecule attached to the polymer, the conductive polymer coating layer is independent of relative humidity in a system. That is, while some conductive polymers include ionomers that consist of hydrophobic backbones and a small amount of ionic moieties attached to or at the terminal of the polymer backbones and/or are copolymers that are copolymerized with polyester-ether or other hydrophilic groups, in which conductivity is based on the water molecules or metal ions that are absorbed by the ionic group or the ether group of these polymers, the present conductive polymer is a conjugated polymer in which conductivity is independent of the relative humidity in an environment, e.g., conductivity will not be affected very much by relative humidity. For example, without wishing to be bound by theory, it is understood that since the conjugated polymer includes a backbone chain of alternating double- and single-bonds, in which overlapping p-orbitals create a system of delocalized x-electrons, conductivity of the conductive polymer is provided, and does not rely on water molecules and/or metal ions for such conductivity.

Additionally, the conductive polymer coating layer 220 has a surface resistivity between E+5 and E+9 $\Omega$cm. The conductive polymer coating layer 220 also meets the cleanliness requirements for semiconductor processing by having an outgassing of less than 4 $\mu$g/g, preferably less than 2 $\mu$g/g, and most preferably less than 0.5 $\mu$g/g, and a total extractable metals of less than 400 ng/g, preferably less than 200 ng/g, and most preferably less than 100 ng/g. It is appreciated that the cleanliness requirements of the conductive polymer coating layer 220 is only achievable by using certain conductive polymers and specific treatments, as discussed below.

Figure 3:
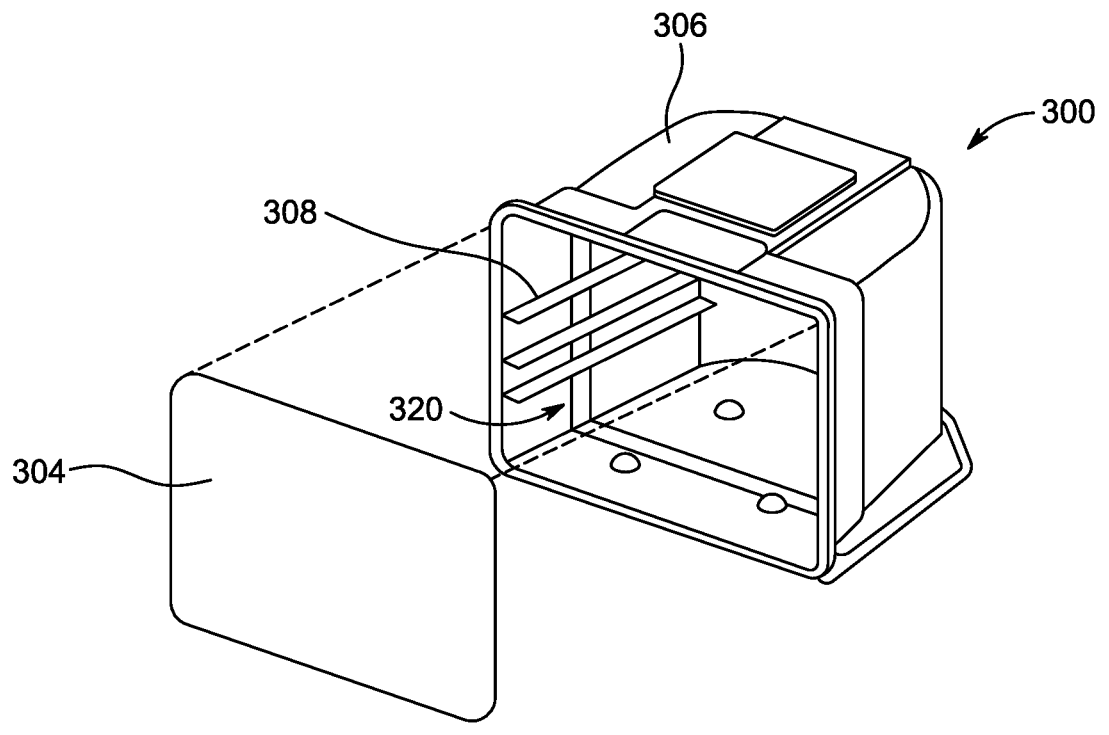
FIG. 3 is a front prospective view of a container having a conductive polymer coating layer, according to at least one other example embodiment.

FIG. 3 is a perspective view of a container 300, according to another embodiment, in which the front door 304 is removed. As shown in FIG. 3, the container 300 includes the front door 304 and a shell 306, and is similar in construction and materials as the container 1 of FIG. 1. The front door 304 is received within a front opening of the shell 306, blocking the front opening. The shell 306 defines an interior space of the container, in which wafers or reticles can be stored in the interior space of the container 30. The container 300 can be accessed by moving (e.g., opening, removing) the door 304. For example, the door 304 in FIG. 3 is received in the shell 306 by inserting the door 304 into the shell 306. In an embodiment, one or more of the door 304 and the shell 306 can include a locking mechanism (not shown) to prevent accidental removal of the door 304. The container 300 may be, for example, a front opening unified pod (FOUP) or a container for a reticle, such as a reticle pod.

The container 300 can include a plurality of wafer or reticle supporting structures 308, for example, shelves for holding a wafer or reticle (not shown) in the interior space. The shelves 308 can be inserted into rails or slots and are sized to each hold a wafer or reticle (not shown) within the interior space. For example, the shelves 308 in an embodiment are sized to hold a specific size of wafer or reticle (e.g., 150 mm wafers, 200 mm wafers, etc.). The container 300 can be loaded and/or unloaded from a load/unload port for loading the wafer or reticle into the container 300 and/or for processing the wafer or reticle in the container 300.

In this embodiment, the entirety of the interior and/or exterior of the housing of the container 300 is not coated with the conductive polymer coating layer, but instead, the conductive polymer coating layer 320 is provided as a strip along at least the inner surface of the container 300. The conductive polymer coating layer 320 can be provided a path to ground through the bottom wall of the container 300. It is appreciated that the conductive polymer coating layer 320 can be provided along the side walls and/or the supporting structures 308 to provide a continuous path to ground through the bottom wall of the container 300. After the container 300 is loaded on the load/unload port, the path to ground is completed so that the electrostatic buildup in or around the container 300 can be discharged. While this embodiment shows the strip of conductive polymer coating

320 along the inner surface, it is appreciated that the strip can also be provided along the outer surface for further electrostatic discharge that is provided alone or in combination with the conductive polymer coating layer along the inner surface.

FIG. 4 is a flow chart for a method 400 of coating a semiconductor handing apparatus for controlling electrostatic discharge, according to an embodiment. For example, the method 400 can be used to coat the container 1 as described above and in FIG. 1. In an embodiment, the container 1 is a FOUP or reticle container.

The operational or processing flow chart 400 can include one or more operations, actions, or functions depicted by one or more blocks 410, 420, 430, 440, and 450. Although illustrated as discrete blocks, various blocks can be divided into additional blocks, combined into fewer blocks, or eliminated, depending on the desired implementation. As a non-limiting example, the blocks of the flow chart 400 can be performed by e.g., any suitable controller having e.g., a processor and/or memory. The method 400 can start at either block 410 or block 420 or block 430. It will be appreciated that block 410 can precede block 420, or vice versa.

At 410, at least a portion of a substrate for a housing or semiconductor supporting structure for a semiconductor processing apparatus is coated with a conductive polymer coating layer. The housing and/or semiconductor supporting structure includes at least a polymer material layer, and the conductive polymer coating layer coats at least the polymer material layer and includes conjugated polymers. It is appreciated that conductive polymer conductive material layer can coat just the portion thereof or the entirety of the housing and/or the semiconductor supporting structure with the conductive polymer coating layer. The substrate can be treated prior to coating. For example, the substrate can be cleaned using water, organic solvents, plasma, ozone, alcohol, using acids, or the like, and then dried prior to coating the substrate. The coating can be applied using a dip coating process, in which the substrate is submerged in a coating precursor solution. If only portions of the substrate are coated, a masking step can be used to mask the portions of the substrate that are not to be coated. The method 400 then proceeds to 420.

At 420, the housing and/or the semiconductor supporting structure having the conductive polymer coating layer is dried at a temperature between 80° C. and 160° C. Following each dip, the substrate is baked at a short time to set the most recently applied layer of the coating. Typically, the substrate is typically baked for from about 2 minutes to about 30 minutes between coatings at a temperature of from between about 80° C. and about 160° C.

After the final dip, when the desired coating thickness has been achieved, the coated substrate can be thermally cured. The thermal curing step involves baking the substrate at an increased temperature for a significantly longer period than the relatively short baking periods following each dip. For example, the thermal curing step typically involves baking the substrate for from about 15 minutes to about 4 hours at a temperature of from about 80° C. to about 160° C.

It is also appreciated that the coating step can include other means for coating, for example, spray coating, vapor deposition, chemical and electrochemical coating, spin coating, roll-to-roll coating, bar coating, or the like, and combinations thereof. If the conductive polymer comprises a polymer that can be polymerized using UV-initiated polymerization, the method can also include a UV-initiated polymerization step.

At 430, the dried housing and/or the semiconductor supporting structure having the conductive polymer coating layer is soaked in 5% HCl aqueous solution.

At 440, the housing and/or the semiconductor supporting structure having the conductive polymer coating layer is removed from the 5% HCl aqueous solution and the housing and/or the semiconductor supporting structure having the conductive polymer coating layer is rinsed and/or soaked in deionized water.

At 450, the housing and/or the semiconductor supporting structure having the conductive polymer coating layer is dried. The resulting conductive polymer coating layer has a total extractable metals less than 200 ng/g, and preferably less than 100 ng/g.

EXAMPLES

For semiconductor processing, the following properties of the conductive polymer coating should be achieved:

ESD target: surface resistivity between $E^{+5}$-$E^{+9}$ Ωcm.

Coating ESD stability: stable at different temperature (up to 100° C.) and different relative humidity.

Coating cleanliness:

a. Outgassing <4 μg/g, preferably <2 μg/g, and most preferably <0.5 μg/g b. Total extractable metals <400 ng/g, preferably <200 ng/g, and most preferably <100 ng/g Coating robustness a. Tape adhesion test to determine the coating binding stability. The tape adhesion test is conducted based on modified ASTM D3359 Method B (Cross-cut). The tests are performed by scribing the coating to the substrate with a sharp knife blade in a cross-cut lattice pattern which is created with two cuts in each direction. Once the incisions are made, a GLTL ASTM D3359 Cross Hatch Adhesion Test Tape is applied over the incisions and pressed in place using a pencil eraser. Following a brief "recovery" period of about 60 seconds, the tape is removed by grasping the free end of the tape and pulling it off rapidly back upon itself at as close to an angle of 180° as possible. After removal of the tape, the amount of coating removed from the substrate and the back of the tape is examined. Adhesion is rated based on the scale provided in the ASTM D3359 standard. The conductive polymer coating layer passes the tape adhesion test if there is no peeling or removal of the coating.

a. Other application requirement such as particle shedding and wafer insertion test, or the like.

It is appreciated that in an embodiment, the surface resistivity can be determined by the following method:

1) Wipe clean the conductive polymer coated polymer plaques first. The cleaning can be performed using water and/or soap, using organic solvents, hydrogen peroxide, acids or etching solutions, plasma cleaning/etching, or the like.

2) Then two probes are used from a surface resistivity meter, for example, PRS-801 Resistance System, to measure the resistivity of the plaques.

It is appreciated that in an embodiment, the outgassing can be determined by the following method:

1) Take 0.1-0.2 grams of the substrate sample and place in an empty thermal desorption (TD) tube.

2) Use thermal desorption on the substrate sample in the TD tube at a temperature of 100 or 200° C. for 30 min to separate the gas from the substrate sample.

3) Analyze the released gas in the TD tube using gas chromatography and mass spectrometry.

It is appreciated that in an embodiment, the extractable metals can be determined by the following method:

1) Taking 20 grams of the substrate sample and placing the substrate sample in a jar, for example, a clean PFA jar, and adding 20 ml of 5% HNO3.

2) Leaching the substrate sample with the 5% HNO3 for 4 hours at 70° C.

3) Removing the leachate into a bottle, for example, a clean PFA bottle, and then analyzing the leachate using inductively coupled plasma mass spectrometry.

4) A blank of 20 ml of 5% HNO3 can be subtracted from the results.

With the above properties and testing procedures of the conductive polymer coating in mind, the following examples are provided to further illustrate various embodiments of the present disclosure.

Comparative Example 1

Substrates comprising polycarbonate (PC) or ultra-high molecular weight polyethylene (UPE) are provided. The substrates of PC and UPE are then dip-coated in a precursor coating composition comprising an aqueous oxidative polymerization of the monomer 3,4-ethylenedioxythiophene (EDOT) in the presence of the polystyrene sulfonic acid (PSS or PSSA). The precursor coating composition is about 90-95% water. The substrates are coated with the precursor coating composition until the conductive polymer coating layer reaches the desired thickness, e.g., from about 200 nm to 10 μm and dried at a temperature between 80° C. and 160° C. to set the coating composition. During the coating of the substrate, the substrates can be dipped multiple times to reach the desired thickness. Following each dip, the substrate can be dried to set the coating layer.

Comparative Example 2

The substrates comprising polycarbonate (PC) or ultra-high molecular weight polyethylene (UPE) are provided similar to Comparative Example 1. However, prior to dip-coating, the substrates of PC and UPE are pre-cleaned. The cleaning can include, but not limited to, rinsing in water and/or soap, using organic solvents, hydrogen peroxide, acids or etching solutions, plasma cleaning/etching, or the like. The substrates of PC and UPE are then dip-coated in a precursor coating composition comprising an aqueous oxidative polymerization of the monomer 3,4-ethylenedioxy-thiophene (EDOT) in the presence of the polystyrene sulfonic acid (PSS or PSSA). The substrates are coated with the precursor coating composition until the conductive polymer coating layer reaches the desired thickness, e.g., from about 200 nm to 10 μm and dried at a temperature between 80° C. and 160° C. to set the coating composition. During the coating of the substrate, the substrates can be dipped multiple times to reach the desired thickness. Following each dip, the substrate can be dried to set the coating layer.

Example Embodiment 1

The substrates comprising polycarbonate (PC) or ultra-high molecular weight polyethylene (UPE) are provided similar to Comparative Example 2. For example, prior to dip-coating, the substrates of PC and UPE are pre-cleaned. The substrates of PC and UPE are then dip-coated in a precursor coating composition comprising an aqueous oxidative polymerization of the monomer 3,4-ethylenedioxy-thiophene (EDOT) in the presence of the polystyrene sulfonic acid (PSS or PSSA). The substrates are coated with the precursor coating composition until the conductive polymer coating layer reaches the desired thickness, e.g., from about 200 nm to 10 μm and dried at a temperature between 80° C. and 160° C. to set the coating composition. During the coating of the substrate, the substrates can be dipped multiple times to reach the desired thickness. Following each dip, the substrate can be dried to set the coating layer. After the dip-coating steps, however, the substrates of PC and UPE are acid washed. Specifically, the dried substrates of PC and UPE are soaked in 5% HCl aqueous solution for at least about 10 hours, and preferably about 15 hours. The substrates of PC and UPE are then rinsed with deionized water and soaked in the deionized water for at least about 4 hours, and preferably about 8 hours, and most preferably about 10 hours. Lastly, the substrates of PC and UPE are dried at a temperature between 80° C. and 160° C. to set the coating composition to dry the substrates of PC and UPE.

Results

Comparative Examples 1 and 2 and the Example Embodiment 1 had some similar results. For example, the conductive polymer coating layers were uniform, semi-transparent, or had a light blue color.

Additionally, as seen in TABLE 1, the substrates of PC and UPE having the conductive polymer coating layer of Comparative Examples 1 and 2 and Example Embodiment 1 met the target surface resistivity for semiconductor processing by being between $E^{+5}$ and $E^{+9}$ Ωcm. It is appreciated that the conductive polymer coating layer having the conjugated polymers is advantageous over other ESD polymers, for example, the ionomer-type ESD polymers. For example, the conductive polymer coating layer having the conjugated polymers has stable surface resistivity even at elevated temperatures, e.g., 100° C., and at high humidity states, e.g., water soaking.

| Samples | SR at Room temperature | SR after 100 C. Oven | SR after water soaking |
|---|---|---|---|
| PC SAR5117-1 | 8.7E + 5 | 1.4E + 6 | 4.1E + 5 |
| PC SAR5117-3 | 1.6E + 7 | 1.2E + 7 | 3.2E + 7 |
| PC SAR5117-4 | 8.9E + 4 | 7.0E + 4 | 8.7E + 4 |
| UPE SAR5117-1 | 1.5E + 7 | 7.9E + 6 | 4.1E + 7 |
| UPE SAR5117-3 | 2.1E + 6 | 1.6E + 6 | 3.4E + 6 |
| UPE SAR5117-4 | 2.7E + 5 | 2.8E + 5 | 3.7E + 5 |

Moreover, the substrates of PC and UPE having the conductive polymer coating layer having the conjugated polymers of Comparative Examples 1 and 2 and Example Embodiment 1 passed the tape test since there was no peeling or removal of the conductive polymer coating layer when tested. It is appreciated that the substrate of UPE can be pre-treated using ozone in order to obtain a more robust coating, which can be used in any of the Examples.

While the substrates of PC and UPE having the conductive polymer coating layer having the conjugated polymers of Comparative Examples 1 and 2 and Example Embodiment 1 met the properties for surface resistivity, coating stability, and coating robustness for semiconductor processing, the substrates having the conductive polymer coating layer of Comparative Examples 1 and 2 did not meet all of the cleanliness targets for semiconductor processing, as discussed below.

Figure 5:
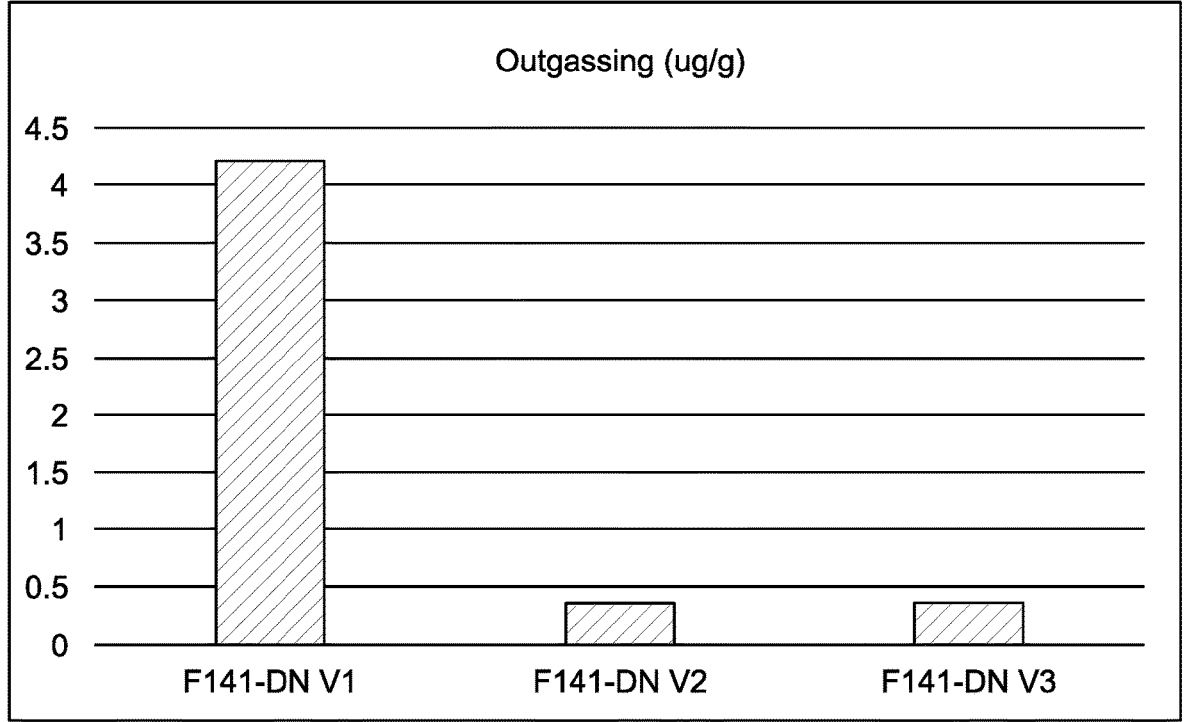
FIG. 5 is a table showing the outgassing of comparative examples and at least one example embodiment.

As seen in FIG. 5, the substrate having the conductive polymer coating of Comparative Example 1 did not meet the coating cleanliness standard for outgassing. Rather, the substrate having the conductive polymer coating of Comparative Example 1 had an outgassing greater than 0.5 μg/g at approximately 4.3 μg/g. However, the substrate having the conductive polymer coating of Comparative Example 2 and Example Embodiment 1 met the target outgassing level of less than 0.5 μg/g.

Figure 6:
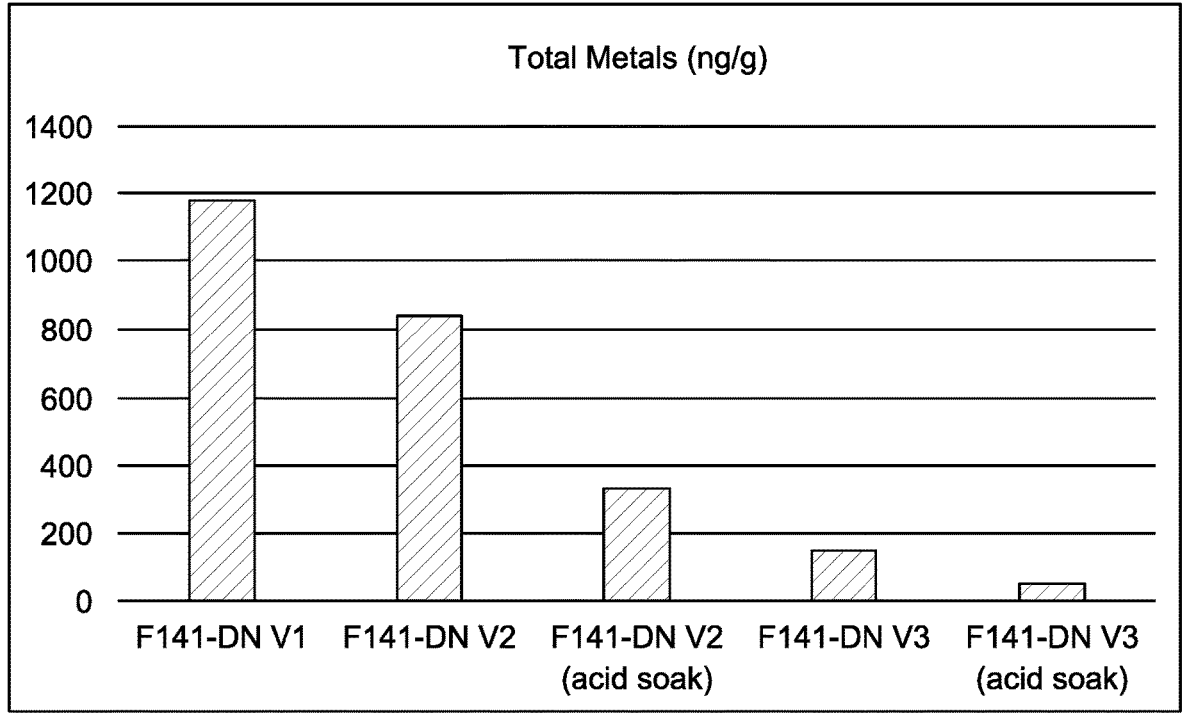
FIG. 6 is a table showing the total extractable metals of comparative examples and at least one example embodiment.

As seen in FIG. 6, neither substrate having the conductive polymer coating of Comparative Examples 1 and 2 met the coating cleanliness standard for total extractable metals. Instead, the substrate having the conductive polymer coating of Comparative Example 1 had the conductive polymer coating layer with a total extractable metals of about 1190 ng/g, whereas the substrate having the conductive polymer coating of Comparative Example 2 had the conductive polymer coating layer with a total extractable metals of about 820 ng/g. It was surprisingly found that if the substrate having the conductive polymer coating of Comparative Example 2 was acid washed, as performed for Example Embodiment 1, the total extractable metals of the conductive polymer coating layer was decreased to about 350 ng/g. Thus, only substrates having the conductive polymer coating prepared as in Example Embodiment 1, e.g., including the acid wash, resulted in the conductive polymer coating layer having a total extractable metals of less than 400 ng/g, preferably less than 200 ng/g, and most preferably less than 100 ng/g to meet the total extractable metals cleanliness target for semiconductor processing.

As seen in FIG. 6, it was surprisingly found that the combination of the selection of the precursor coating composition that included binders and/or surfactants, e.g., neutral surfactants, that have low to no amounts of certain metals and the acid wash step, resulted in a conductive polymer coating that met or exceeded the cleanliness standards of outgassing and total extractable metals for semiconductor processing. That is, while the acid wash step reduces some of the total extractable metals in the conductive polymer coating layer, the combination of the preparation of the substrate having the conductive polymer coating of Example Embodiment 1 surprisingly resulted in a more than additive reduction in the total extractable metals in the conductive polymer coating layer by having a total extractable metals of less than 100 ng/g.

In view of the above, it is appreciated that the conductive polymer coating layer as discussed herein met or exceeded the properties of the conductive polymer coating for semiconductor processing. Thus, the embodiments disclosed herein can improve electrostatic discharge dissipation of the semiconductor processing system and thus improve the longevity, yield, etc. of the various apparatuses and substrates used in the semiconductor processing system, and mitigate the defects and/or the damage and/or safety issues associated with the buildup of static charge.

Aspects. It is noted that any of aspects 1-15 can be combined with any one of aspects 16-17 and vice versa.

Aspect 1. A semiconductor processing apparatus comprising: a substrate comprising a polymer material layer; a conductive polymer coating layer that coats at least a portion of the polymer material layer of the substrate, wherein the conductive polymer coating layer comprises conjugated polymers, wherein the conductive polymer coating layer has a total extractable metals less than 400 ng/g, wherein the conductive polymer coating layer is configured to discharge electrostatic buildup in the semiconductor processing apparatus when connected to a semiconductor processing system.

Aspect 2. The semiconductor processing apparatus according to Aspect 1, wherein the conductive polymer coating layer consists essentially of polymers.

Aspect 3. The semiconductor processing apparatus according to any of Aspects 1 and 2, wherein the conductive polymer coating layer is semitransparent.

Aspect 4. The semiconductor processing apparatus according to any of Aspects 1-3, wherein the substrate comprises a polymer, wherein the polymer is at least one of polycarbonate, polyethylene, high density polyethylene (HDPE), polypropylene, polyolefin, cyclic olefin copolymer, polyether ether ketone (PEEK), or combination thereof.

Aspect 5. The semiconductor processing apparatus according to any of Aspects 1-4, wherein the conductive polymer coating layer has a surface resistivity between E+5 and E+9 Ωcm.

Aspect 6. The semiconductor processing apparatus according to any of Aspects 1-5, wherein the conductive polymer coating layer has outgassing less than 4 µg/g, and preferably less than 0.5 µg/g.

Aspect 7. The semiconductor processing apparatus according to any of Aspects 1-6, wherein the conductive polymer coating layer has the total extractable metals less than 200 ng/g, and preferably less than 100 ng/g.

Aspect 8. The semiconductor processing apparatus according to any of Aspects 1-7, wherein the conductive polymer coating layer has a thickness between 200 nm and 10 micrometers.

Aspect 9. The semiconductor processing apparatus according to any of Aspects 1-8, wherein the conductive polymer coating layer is a surface active material.

Aspect 10. The semiconductor processing apparatus according to any of Aspects 1-9, wherein the conductive polymer coating layer comprises at least one of a polyacetylene, a poly(fluorene), a polyphenylene, a polyphenylene vinylene, a polypyrene, a polyazulene, a polynaphthalene, a poly(pyrrole), a polycarbazole, a polyindole, a polyazepine, a polyaniline, a polyacene, a polythiophene, a polythiophene vinylene, a poly(p-phenylene sulfide), a polypyridine, or functionalized derivatives, precursors or combinations thereof.

Aspect 11. The semiconductor processing apparatus according to Aspect 10, wherein the conjugated polymer comprises a Nitrogen-containing or Sulfur-containing heteroatom.

Aspect 12. The semiconductor processing apparatus according to any of Aspects 1-11, wherein the semiconductor processing apparatus is selected from the group consisting of a front-opening unified pod, a wafer carrier, a reticle carrier, or similar container or box for semiconductor processing.

Aspect 13. The semiconductor processing apparatus according to Aspect 12, wherein the semiconductor processing apparatus further comprises a semiconductor supporting structure configured to accommodate one or more semiconductor substrates, wherein the conductive polymer coating layer coats at least a portion of the semiconductor supporting structure.

Aspect 14. The semiconductor processing apparatus according to Aspect 13, wherein the conductive polymer coating layer is configured to discharge the electrostatic buildup by providing a path to ground when the semiconductor processing apparatus is connected to a load port of the semiconductor processing system.

Aspect 15. The semiconductor processing apparatus according to any of Aspects 1-14, wherein the conductive polymer coating layer does not include a water molecule attached to the polymer so that the conductive polymer coating layer is independent of relative humidity in a system.

Aspect 16. A method for coating a semiconductor processing apparatus for controlling electrostatic discharge comprising: coating at least a portion of at least one of a substrate or semiconductor supporting structure of a semiconductor processing apparatus with a conductive polymer coating layer, wherein the substrate and/or the semiconductor supporting structure comprises a polymer material layer, wherein the conductive polymer coating layer comprises conjugated polymers; drying the substrate and/or the semiconductor supporting structure having the conductive polymer coating layer; soaking the dried substrate and/or the semiconductor supporting structure having the conductive polymer coating layer in 5% HCl aqueous solution; removing the substrate and/or the semiconductor supporting structure having the conductive polymer coating layer from the 5% HCl aqueous solution and rinsing and/or soaking the substrate and/or the semiconductor supporting structure having the conductive polymer coating layer in deionized water; and drying the substrate and/or the semiconductor supporting structure having the conductive polymer coating layer, wherein the conductive polymer coating layer has a total extractable metals less than 400 ng/g.

Aspect 17. The method for coating a semiconductor processing apparatus according to Aspect 16, wherein the coating further comprises coating an entirety of the substrate and/or the semiconductor supporting structure with the conductive polymer coating layer.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A semiconductor processing apparatus comprising:
a substrate comprising a polymer material layer; and
a conductive polymer coating layer that coats at least a portion of the polymer material layer of the substrate, wherein the conductive polymer coating layer comprises conjugated polymers, wherein the conductive polymer coating layer has a total extractable metals of less than 400 ng/g and an outgassing level of less than 4 µg/g, and wherein the conductive polymer coating layer is configured to discharge electrostatic buildup in the semiconductor processing apparatus when connected to a semiconductor processing system.

2. The semiconductor processing apparatus according to claim 1, wherein the conductive polymer coating layer consists essentially of polymers.

3. The semiconductor processing apparatus according to claim 1, wherein the conductive polymer coating layer is semitransparent.

4. The semiconductor processing apparatus according to claim 1, wherein the substrate comprises a polymer, wherein the polymer is at least one of polycarbonate, polyethylene, high density polyethylene (HDPE), polypropylene, polyolefin, cyclic olefin copolymer, polyether ether ketone (PEEK), or combination thereof.

5. The semiconductor processing apparatus according to claim 1, wherein the conductive polymer coating layer has a surface resistivity between E+5 and E+9 Ωcm.

6. The semiconductor processing apparatus according to claim 1, wherein the conductive polymer coating layer has the total extractable metals less than 200 ng/g.

7. The semiconductor processing apparatus according to claim 1, wherein the conductive polymer coating layer has a thickness between 200 nm and 10 micrometers.

8. The semiconductor processing apparatus according to claim 1, wherein the conductive polymer coating layer is a surface active material.

9. The semiconductor processing apparatus according to claim 1, wherein the conductive polymer coating layer comprises at least one of a polyacetylene, a poly(fluorene), a polyphenylene, a polyphenylene vinylene, a polypyrene, a polyazulene, a polynaphthalene, a poly(pyrrole), a polycarbazole, a polyindole, a polyazepine, a polyaniline, a polyacene, a polythiophene, a polythiophene vinylene, a poly(p-phenylene sulfide), a polypyridine, or functionalized derivatives, precursors or combinations thereof.

10. The semiconductor processing apparatus according to claim 9, wherein the conjugated polymer comprises a Nitrogen-containing or Sulfur-containing heteroatom.

11. The semiconductor processing apparatus according to claim 1, wherein the semiconductor processing apparatus is selected from the group consisting of a front-opening unified pod, a wafer carrier, a reticle carrier, or similar container or box for semiconductor processing.

12. The semiconductor processing apparatus according to claim 11, wherein the semiconductor processing apparatus further comprises a semiconductor supporting structure configured to accommodate one or more semiconductor substrates, wherein the conductive polymer coating layer coats at least a portion of the semiconductor supporting structure.

13. The semiconductor processing apparatus according to claim 12, wherein the conductive polymer coating layer is configured to discharge the electrostatic buildup by providing a path to ground when the semiconductor processing apparatus is connected to a load port of the semiconductor processing system.

14. The semiconductor processing apparatus according to claim 1, wherein the conductive polymer coating layer does not include a water molecule attached to the polymer so that the conductive polymer coating layer is independent of relative humidity in a system.

* * * * *